United States Patent
Doris et al.

(10) Patent No.: US 9,356,119 B2
(45) Date of Patent: May 31, 2016

(54) MOSFETS WITH REDUCED CONTACT RESISTANCE

(71) Applicant: GLOBALFOUNDRIES INC., Grand Cayman (KY)

(72) Inventors: Bruce B. Doris, Brewster, NY (US); Kangguo Cheng, Guilderland, NY (US); Ali Khakifirooz, Slingerlands, NY (US); Pranita Kerber, Slingerlands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/770,545

(22) Filed: Feb. 19, 2013

(65) Prior Publication Data

US 2013/0157423 A1 Jun. 20, 2013

Related U.S. Application Data

(62) Division of application No. 12/719,934, filed on Mar. 9, 2010, now Pat. No. 8,450,807.

(51) Int. Cl.
*H01L 29/66* (2006.01)
*H01L 21/285* (2006.01)
(Continued)

(52) U.S. Cl.
CPC .... *H01L 29/66477* (2013.01); *H01L 21/28518* (2013.01); *H01L 29/0847* (2013.01);
(Continued)

(58) Field of Classification Search
CPC ................. H01L 29/66477; H01L 21/28518; H01L 23/485; H01L 29/165; H01L 29/66628; H01L 21/823418; H01L 21/568; H01L 23/3128; H01L 29/41766; H01L 29/41725; H01L 29/41783; H01L 29/45; H01L 29/456; H01L 29/0847
USPC .......................................... 438/197; 257/384
See application file for complete search history.

(56) References Cited

U.S. PATENT DOCUMENTS 5,619,057 A * 4/1997 Komatsu ........................ 257/382
6,395,603 B1 * 5/2002 Tseng ............... H01L 21/28273
257/E21.209

(Continued)

OTHER PUBLICATIONS

"A Cost Effective Embedded DRAM Integration for High Density Memory and High Performance Logic Using 0.15 um Technology Node and Beyond" by Daewon Ha, Member, IEEE, Dongwon Shin, Gwan-Hyeob Koh, Jaegu Lee, Sanghyeon Lee, Yong-Seok Ahn, HongSik Jeong, Taeyoung Chung, and Kinam Kim, published by IEEE Transactions on Electron Devices Jul. 2000.*

(Continued)

*Primary Examiner* — Eve Y Montalvo
*Assistant Examiner* — Nga Doan
(74) *Attorney, Agent, or Firm* — Scully, Scott, Murphy & Presser, P.C.

(57) ABSTRACT

A method and structure for forming a field effect transistor with reduced contact resistance are provided. The reduced contact resistance is manifested by a reduced metal semiconductor alloy contact resistance and a reduced conductively filled via contact-to-metal semiconductor alloy contact resistance. The reduced contact resistance is achieved in this disclosure by texturing the surface of the transistor's source region and/or the transistor's drain region. Typically, both the source region and the drain region are textured in the present disclosure. The textured source region and/or the textured drain region have an increased area as compared to a conventional transistor that includes a flat source region and/or a flat drain region. A metal semiconductor alloy, e.g., a silicide, is formed on the textured surface of the source region and/or the textured surface of the drain region. A conductively filled via contact is formed atop the metal semiconductor alloy.

18 Claims, 4 Drawing Sheets

(51) Int. Cl.
    *H01L 29/08*     (2006.01)
    *H01L 29/417*     (2006.01)
    *H01L 29/45*     (2006.01)
    *H01L 23/485*     (2006.01)
    *H01L 29/165*     (2006.01)

(52) U.S. Cl.
    CPC .... *H01L29/41725* (2013.01); *H01L 29/41766* (2013.01); *H01L 29/41783* (2013.01); *H01L 29/45* (2013.01); *H01L 29/456* (2013.01); *H01L 29/66628* (2013.01); *H01L 29/66636* (2013.01); *H01L 23/485* (2013.01); *H01L 29/165* (2013.01); *H01L 2924/0002* (2013.01)

(56) References Cited

U.S. PATENT DOCUMENTS

| | | | |
|---|---|---|---|
| 6,475,859 | B1 | 11/2002 | Tews et al. |
| 6,521,515 | B1 | 2/2003 | Kluth |
| 7,023,055 | B2 | 4/2006 | Ieong et al. |
| 7,112,505 | B2 | 9/2006 | Wu |
| 7,122,437 | B2 | 10/2006 | Dyer et al. |
| 7,329,923 | B2 | 2/2008 | Doris et al. |
| 7,408,216 | B2 | 8/2008 | Forbes et al. |
| 2004/0046197 | A1* | 3/2004 | Basceri et al. ........... 257/296 |
| 2005/0116290 | A1 | 6/2005 | de Souza et al. |
| 2006/0275992 | A1 | 12/2006 | Mansoori et al. |

OTHER PUBLICATIONS

"Plasma Hydrgenation of Metal—Induced Laterally Crystallized Thin Film Transistors" by Authors Gururaj Bhat, Hoi Kwok, and Man Wong, published by IEEE Electro Device Letters, vol. 21, No. 2, Feb. 2000.*

* cited by examiner

MOSFETS WITH REDUCED CONTACT RESISTANCE

CROSS REFERENCE TO RELATED APPLICATION

This application is a divisional of U.S. patent application Ser. No. 12/719,934, filed Mar. 9, 2010 the entire content and disclosure of which is incorporated herein by reference.

BACKGROUND

The present invention relates to a semiconductor structure and a method of fabricating the same. More particularly, the present invention relates to a metal oxide semiconductor field effect transistor (MOSFET) having a reduced contact resistance and a method of fabricating such a MOSFET.

One trend in modern integrated circuit manufacturing is to produce semiconductor devices, such as field effect transistors (FETs), which are as small as possible. In a typical FET, a source and a drain are formed in an active area of a semiconductor substrate by implanting n-type or p-type impurities in the semiconductor material. Disposed between the source and the drain is a channel (or body) region. Disposed above the channel region is a gate electrode. The gate electrode and body are spaced apart by a gate dielectric layer.

Although the fabrication of smaller transistors allows more transistors to be fabricated on a single semiconductor substrate for the formation of relatively large circuit systems in a relatively small die area, this downscaling can result in a number of performance degradation effects. For example, the downscaling of a transistor can result in shrinking of the gate pitch as well as a reduction in the area of the source and drain. The decreased area of the source and drain in turn leads to a decreased area for forming a metal semiconductor alloy contact and an overlying conductively filled via contact. For example, with a gate pitch of 80 nm, a gate length of 20 nm, and a spacer width of 15 nm, the source/drain area for the metal semiconductor alloy contact and the overlying conductively filled via contact is only 30 nm.

In conventional scaled FETs, the metal semiconductor alloy contact resistance and the conductively filled via contact-to-metal semiconductor alloy contact resistance are both increasing to an extent that the FET device performance is being substantially degraded.

SUMMARY

The present invention provides a method and structure for forming a field effect transistor with reduced contact resistance. The reduced contact resistance is manifested by a reduced metal semiconductor alloy contact resistance and a reduced conductively filled via contact-to-metal semiconductor alloy contact resistance. The reduced contact resistance is achieved in this disclosure by texturing the surface of the transistor's source region and/or the transistor's drain region. Typically, both the source region and the drain region are textured in the present disclosure.

The textured source region and/or the textured drain region have an increased area as compared to a conventional transistor that includes a flat, e.g., planar, source region and/or a flat, e.g., planar, drain region. A metal semiconductor alloy, e.g., a silicide, is formed on the textured surface of the source region and/or the textured surface of the drain region. A conductively filled via contact is formed atop the metal semiconductor alloy.

In one aspect of the invention, a semiconductor structure having a reduced contact resistance is provided. The semiconductor structure includes at least one transistor located upon and within a semiconductor substrate. The at least one transistor includes a gate stack located on an upper surface of the semiconductor substrate. The transistor further includes a source region and a drain region located within the semiconductor substrate at the footprint of the gate stack. At least one of the source region and the drain region has a textured surface. By "textured surface" it is meant that the source region and/or the drain region have a roughened semiconductor surface which does not include a planar upper surface. Instead, the roughened surface has an undulating, e.g., rising and falling, semiconductor surface that includes at least one peak and at least one valley. A metal semiconductor alloy, e.g., a silicide, is disposed on the textured surface of the source region and/or the textured surface of the drain region. A conductively filled via contact is formed atop the metal semiconductor alloy.

In some embodiments, the textured source region and/or textured drain region has at least one valley that is located on the original planar surface of the source region and/or drain region. In some other embodiments, the textured source region and/or textured drain region has at least one valley that is located beneath the original planar surface of the source region and/or drain region.

In both the aforementioned embodiments, the peak of the textured semiconductor surface is located above the original planar surface of the source region and/or the drain region.

In another aspect of the present invention, a method of fabricating a semiconductor structure with reduced contact resistance is provided. The method includes providing at least one transistor located within and upon a semiconductor substrate. The at least one transistor includes a gate stack located on an upper surface of the substrate. The at least one transistor also includes a source region and a drain region located within the semiconductor substrate at a footprint of the gate stack. The source region and the drain region have a planar upper surface. The source region and/or the drain region is then textured to include a roughened semiconductor surface that includes at least one peak and at least one valley.

In one embodiment, the textured surface is provided by forming a hemispherical grained semiconductor material on the upper planar surface of the source region and/or drain region. In another embodiment, the textured surface is provided by forming a hemispherical grained semiconductor material on the upper planar surface of the source region and/or drain region and then etching exposed portions of the semiconductor substrate utilizing the hemispherical grained semiconductor material as an etch mask.

A metal semiconductor alloy, e.g., a silicide, is disposed on the textured surface of the source region and/or the textured surface of the drain region. A conductively filled via contact is formed atop the metal semiconductor alloy.

DETAILED DESCRIPTION

The present invention, which provides a FET with reduced contact resistance and a method of fabricating such a semiconductor structure, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is first made to FIGS. 1-4 which are pictorial representations (through cross sectional views) illustrating an exemplary semiconductor structure of the present invention through various processing steps in accordance with one embodiment of the invention. In this embodiment, the contact resistance of the transistor is reduced by texturing the surface of both the source region and the drain region with a hemispherical grained (HSG) semiconductor material. It is noted that although the following discussion and drawings illustrate an embodiment in which the source region and the drain region are textured, the present invention also can be used to form a structure in which only one of the source region or the drain region is textured. When only one of the source region or drain region is to be textured, conventional block mask technology can be used to prevent texturing of one of the source region or the drain region.

Figure 1:
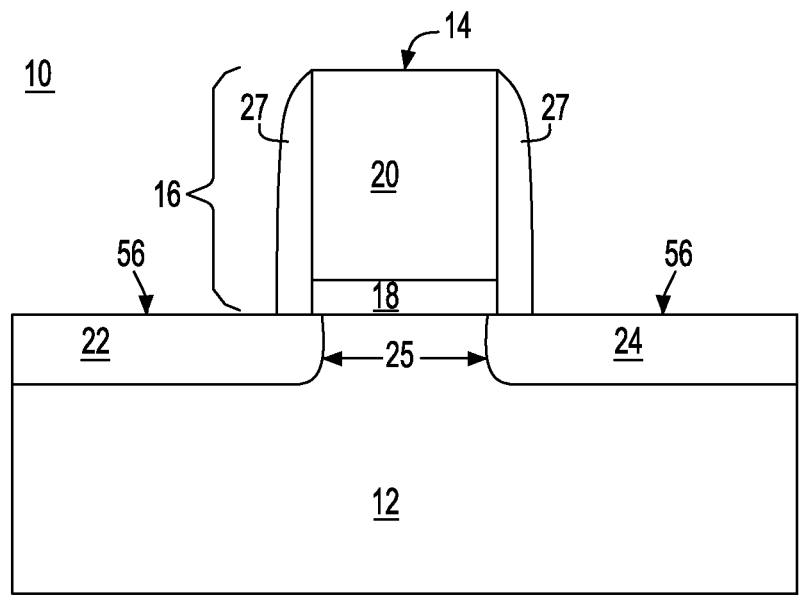
FIG. 1 is a pictorial presentation (through a cross sectional view) illustrating an initial structure including at least one transistor located on a surface of a semiconductor substrate that can be employed in one embodiment of the invention.

Reference is first made to FIG. 1 which illustrates an initial structure 10 that can be employed in this embodiment of the invention. The initial structure 10 includes a semiconductor substrate 12 which has at least one transistor 14 located within, and upon, the semiconductor substrate 12. The at least one transistor 14 includes a gate stack 16 that is located on an upper surface of the semiconductor substrate 14. The gate stack 16 includes at least a gate dielectric 18 and an overlying gate conductor 20. The at least one transistor 14 further includes a source region 22 and a drain region 24 that are located within the semiconductor substrate 12 at the footprint of the gate stack 16. A channel region 25 is located between the source region 22 and the drain region 24. The channel region 25 is also located directly beneath the gate stack 16. The initial structure 10 illustrated in FIG. 1 may optionally include at least one spacer 27 located on sidewalls of the gate stack 16.

It is noted that although the drawings and following discussion illustrate the presence of a single transistor 14 located within and upon the semiconductor substrate 12, the present invention also works in cases in which a plurality of transistors are present. The plurality of transistors can be all of the same conductivity type, i.e., n-type transistors or p-type transistors, or some of the transistors can be n-type and some can be p-type.

The initial structure 10 illustrated in FIG. 1 is composed of materials that are well known to those skilled in the art. Also, the initial structure 10 can be fabricated utilizing processing techniques that are also well known to those skilled in the art.

The semiconductor substrate 12 illustrated in FIG. 1 is comprised of any semiconductor material including, but not limited to Si, Ge, SiGe, SiC, SiGeC, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In some embodiments, the semiconductor substrate 12 is composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 12 may also include a first doped (n- or p-) region, and a second doped (n- or p-) region. For clarity, the doped regions are not specifically shown in any of the drawings of the present application. The first doped region and the second doped region may be the same, or they may have different conductivities and/or doping concentrations. These doped regions are known as "wells" and they are formed utilizing conventional ion implantation processes.

At least one isolation region (not shown) can be formed into the semiconductor substrate 12. The at least one isolation region is typically formed prior to forming the at least one transistor 14. The at least one isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation region provides isolation between neighboring gate regions, typically required when the neighboring gates have opposite conductivities, i.e., nFETs and pFETs.

After processing the semiconductor substrate 12 as described above, the gate stack 16 of the at least one transistor 14 is formed on the surface of the semiconductor substrate 12. The gate stack 16 can be formed by deposition of various material layers, lithography and etching. Alternatively, a replacement gate process can be used in forming the gate stack 16.

As mentioned above, the gate stack 16 includes at least a gate dielectric 18 and an overlying gate conductor 20. The gate dielectric 18 of gate stack 16 includes an oxide, a nitride, an oxynitride, or multilayered stacks thereof.

In one embodiment of the invention, the gate dielectric 18 is comprised of a semiconductor oxide, a semiconductor nitride and/or a semiconductor oxynitride nitride. The semiconductor material used in forming the semiconductor oxide, nitride or oxynitride can be the same or different semiconductor material as the semiconductor substrate 12. In one embodiment, the gate dielectric 18 is comprised of silicon oxide and/or silicon nitride.

In another embodiment of the invention, the gate dielectric 18 can be comprised of a high k gate dielectric. The term "high k" when referring to gate dielectric 18 denotes any dielectric metal oxide having a dielectric constant that is greater than the dielectric constant of silicon oxide, e.g., 3.9. Typically, the high k gate dielectric that can be employed as gate dielectric 18 has a dielectric constant greater than 4.0, with a dielectric constant of greater than 8.0 being even more typical. Exemplary high k dielectric materials include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the gate dielectric 18. Each value of x is independently from 0.5 to 3 and each value of y is independently from 0 to 2.

In yet another embodiment of the invention, the gate dielectric 18 includes a multilayered stack of a semiconductor-containing gate dielectric, e.g., silicon oxide, and a high k gate dielectric, e.g., $HfO_2$.

Notwithstanding the type of gate dielectric material employed, the gate dielectric 18 can be formed by deposition methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. Alternatively, the gate dielectric 18 can be formed by a thermal process such as, for example, thermal oxidation and/or thermal nitridation. In some embodiments of the invention, the gate dielectric 18 can be formed utilizing a combination of thermal processing and deposition.

The thickness of the gate dielectric 18 may vary depending on the technique used to form the same, as well as the type and/or number of gate dielectric materials employed. Typically, however, the gate dielectric 18 has a thickness from 0.5 nm to 10 nm, with a thickness from 1.0 nm to 5 nm being more typical. When the gate dielectric 18 is a high k gate dielectric material, the high k gate dielectric material may have an effective oxide thickness on the order of, or less than, 1 nm.

The gate conductor 20 illustrated in FIG. 1 comprises any conductive material including, but not limited to doped silicon, doped silicon germanium, doped germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered stacks thereof.

The gate conductor 20 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When Si-containing or Ge-containing materials are used as the gate conductor 20, the Si-containing or Ge-containing materials can be doped with an appropriate impurity by utilizing either an in-situ doping deposition process or by utilizing deposition, followed by a step such as ion implantation or gas phase doping in which the appropriate impurity is introduced into the Si-containing or Ge-containing material. When a metal silicide is formed, a conventional silicidation process is employed.

The thickness of the gate conductor 20 may vary depending on the technique used to form the same, as well as the type and/or number of gate conductor materials employed. Typically, however, the gate conductor 20 has a thickness from 5 nm to 150 nm, with a thickness from 20 nm to 50 nm being more typical.

In some embodiments of the invention, a hardmask (not shown) can be located on an upper surface of the gate conductor 20. When present, the hardmask can be composed of an oxide, a nitride, an oxynitride or a multilayered stack thereof. In one embodiment, the hardmask is composed of silicon oxide and/or silicon nitride. The hardmask, can be formed by growing techniques well known to those skilled in the art including thermal oxidation and/or nitridation. Alternatively, the hardmask can be formed by a conventional deposition process including, for example, chemical vapor deposition (CVD), plasma enhanced chemical vapor deposition (PECVD), evaporation, and atomic layer deposition (ALD).

The thickness of the hardmask may vary depending on the technique used to form the same, as well as the type and/or number of hardmask materials employed. Typically, however, the hardmask has a thickness from 10 nm to 100 nm, with a thickness from 20 nm to 50 nm being more typical.

Typically and after forming the gate stack 16 of the transistor 14, a source extension region (not shown) and a drain extension region (not specifically shown) are formed into portions of the semiconductor substrate 12 that are at the footprint of the gate stack 16. The source extension region and the drain extension, collectively referred to herein after as the source/drain extension regions, are formed utilizing a conventional extension ion implantation process. The source/ drain extension regions can be activation immediately after the extension ion implantation process using activation anneal conditions that are well known to those skilled in the art. Alternatively, the source/drain extension regions can be activated during a subsequent thermal process described herein, e.g., an activation anneal for activating the source region and the drain region to be subsequently formed. In some embodiments, for example, when a replacement gate process is used in forming the gate stack 16, the source/drain extension regions can be formed prior to forming the gate stack 16.

As mentioned above, the initial structure 10 illustrated in FIG. 1 may optionally include at least one spacer 27 located on sidewalls of the gate stack 16. The optional at least one spacer 27 can be formed prior to, or after, formation of the gate stack 16 utilizing processing techniques well known to those skilled in the art. In one embodiment, the at least one spacer 27 is formed by deposition of a spacer material and etching. The at least one spacer 27 can be composed of an oxide, a nitride and/or an oxynitride. In one embodiment, the at least one spacer 27 can be comprised of a low k dielectric spacer material which has a dielectric constant of less than silicon oxide. Typically, the at least one spacer 27 is comprised of a silicon oxide and/or silicon nitride.

The initial structure 10 shown in FIG. 1 also includes a source region 22 and a drain region 24 located within the semiconductor substrate 12 at the footprint of the gate stack 16. At this point of the invention, both the source region 22 and the drain region 24 have a planar upper surface 56.

The source region 22 and the drain region 24 are formed utilizing any conventional source/drain ion implantation process. The source region 22 and the drain region 24 can be formed prior to, or after, the gate stack 16 is formed. The source region 22 and the drain region 24 can be activated any time after formation of the source and drain regions utilizing any conventional activation anneal process known to those skilled in the art. It is noted that the source region 22 and the drain region 24 illustrated in the drawings inherently include their respective source/drain extension region.

Figure 2:
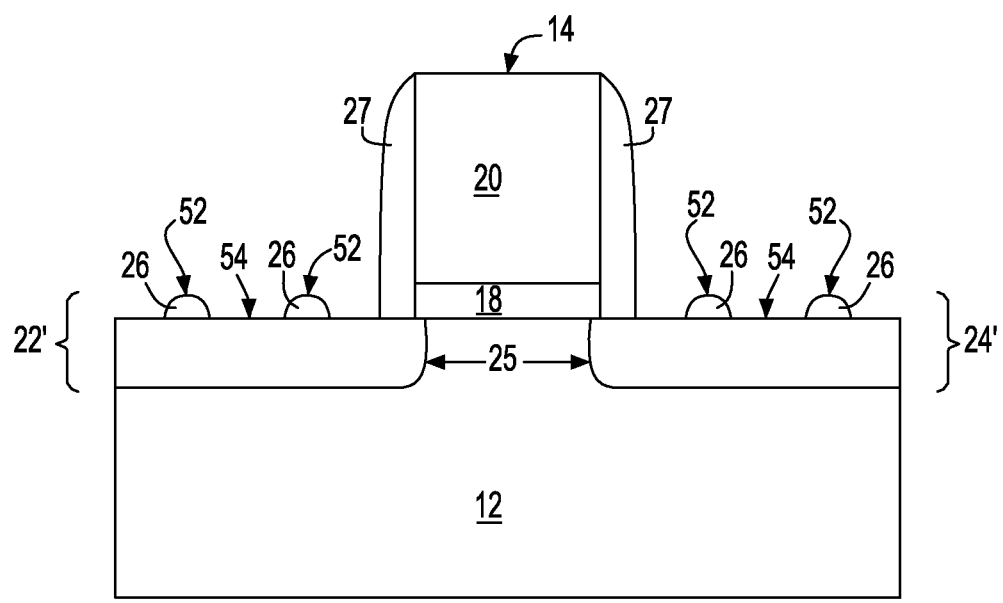
FIG. 2 is a pictorial representation (through a cross sectional view) illustrating the structure of FIG. 1 after texturing the source region and the drain region of the at least one transistor to enhance the surface area of both the source region and the drain region in accordance with one embodiment of the invention.

Referring now to FIG. 2, there is illustrated the structure of FIG. 1 after texturing the source region 22 and the drain region 24 into textured source region 22' and textured drain region 24'. The textured source region 22' and the textured drain region 24' each have a roughened upper semiconductor surface as compared to the original source region 22 and the drain region 24. The roughened semiconductor surface provides an increased area of both the source region and the drain region. That is, the textured source region 22' and the textured drain region 24' each have a surface area that is larger than the original planar source and drain regions. In this embodiment, the textured surface is a result of forming a hemispherical grained (HSG) semiconductor material 26 on the planar upper surface 56 of the source region 22 and the drain region 24.

By "textured surface" it is meant that the source region 22 and the drain region 24 have a roughened semiconductor surface including the hemispherical grained (HSG) semiconductor material 26 which does not include a planar upper surface that extends the entirety of the source and drain regions. Instead, the roughened semiconductor surface including the hemispherical grained (HSG) semiconductor material 26 has an undulating, e.g., rising and falling, semiconductor surface that includes at least one peak and at least one valley. The at least one peak (designated as 52 in the drawings) represents the topmost surface of the HSG semiconductor material 26. In some embodiments and as illustrated in FIG. 2, the textured source region 22' and the textured drain region 24' have a roughened semiconductor surface that includes at least one valley (designated as 54 in the drawings) that is located on the original planar surface of the source region 22 and drain region 24. In some other embodiments, the textured source region and/or textured drain regions have a roughened semiconductor surface that includes at least one valley 54 that is located beneath the original planar surface 56 of the source region 22 and/or drain region 24. This embodiment is shown, for example, in FIG. 5 herein below. In both the aforementioned embodiments, the peak 52 of the roughened semiconductor surface which is defined by the topmost surface of the hemispherical grained semiconductor material 26 is located above the original planar surface 56 of the source region 22 and/or the drain region 24.

As illustrated, the textured source region 22' and the textured drain region 24' include hemispherical grained (HSG) semiconductor material 26 located an upper surface of the original source region 22 and the original drain region 24. The hemispherical grained (HSG) semiconductor material 26 that is located on the upper surface of the original source region 22 and the original drain region 24 can be composed of the same or different, typically the same, semiconductor material as that of the semiconductor substrate 12. In one embodiment of the invention, the hemispherical grained (HSG) semiconductor material is comprised of silicon, silicon germanium, or germanium.

The hemispherical grained (HSG) semiconductor material 26 can be undoped or doped. When doped, the hemispherical grained (HSG) semiconductor material 26 is typically doped within the same type of dopant as that present in the source region 22 and the drain region 24. The dopant can be introduced into the hemispherical grained (HSG) semiconductor material 26 utilizing an in-situ dopant technique or ex-situ utilizing a gas phase doping technique. In some embodiments, these dopant techniques can be used instead of the ion implantation process mentioned above for forming the source region 22 and the drain region 24.

The hemispherical grained (HSG) semiconductor material 26 may be amorphous, polycrystalline or single-crystalline. In some embodiments, the hemispherical grained (HSG) semiconductor material 26 has the same crystal orientation as that of the underlying substrate 12.

In one embodiment, the hemispherical grained (HSG) semiconductor material 26 can be formed selectively only on exposed surfaces of the source region 22 and drain region 24. In another embodiment, the hemispherical grained (HSG) semiconductor material 26 can be formed on all exposed surfaces of the structure shown in FIG. 1 utilizing a non-selective deposition process.

The hemispherical grained (HSG) semiconductor material 26 can be formed utilizing conventional techniques that are well known to those skilled in the art. In one embodiment of the invention, hemispherical grained (HSG) semiconductor material 26 is formed by a chemical vapor deposition process utilizing any well known hemispherical grained (HSG) semiconductor material precursor such as, for example, $SiH_4$, $SiHCl_3$, and $GeH_4$. The chemical vapor deposition process may include a low pressure chemical vapor deposition process, a rapid thermal chemical vapor deposition process, and a plasma enhanced chemical vapor deposition. The chemical vapor deposition of the hemispherical grained (HSG) semiconductor material 26 is typically performed at a temperature from 350° C. to 1000° C., with a deposition temperature from 400° C. to 900° C. being more typical. Optionally, a thermal anneal process can be performed after the deposition of the HSG semiconductor material 26 so that the HSG semiconductor material 26 can transform to a similar crystal structure as that of the underlying semiconductor substrate 12. When employed, this anneal is performed at a temperature above 550° C. The optional thermal anneal is typically performed within an inert atmosphere. The thermal anneal process may include but is not limited to, laser anneal, rapid thermal anneal, furnace anneal, and flash anneal.

Figure 3:
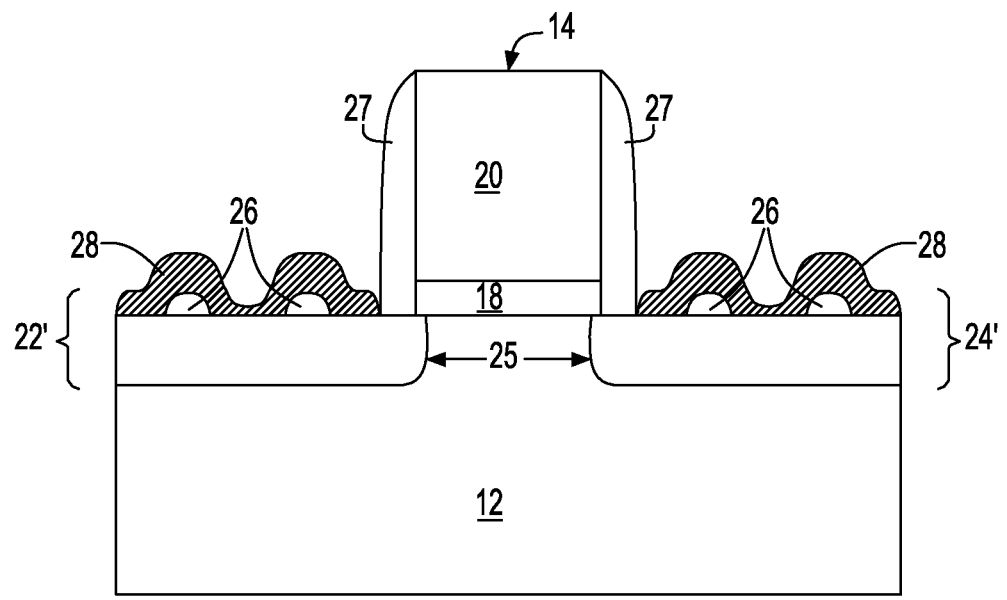
FIG. 3 is a pictorial representation (through a cross sectional view) illustrating the structure of FIG. 2 after forming a metal semiconductor alloy on the textured source region and the textured drain region of the at least one transistor.

Referring now to FIG. 3, there is illustrated the structure of FIG. 2 after forming a metal semiconductor alloy 28 atop the textured source region 22' and the textured drain region 24'. Since the metal semiconductor alloy contact 28 is located on textured source and drain regions which have larger areas compared with conventional planar source and drain regions, the metal semiconductor alloy 28 has an increased contact area.

In one embodiment, the metal semiconductor alloy 28 may be a metal silicide. In another embodiment of the invention, the metal semiconductor alloy 28 may be a metal germanide. In another embodiment of the invention, the metal semiconductor alloy 28 may be a mix of metal silicide and metal germanide.

The metal semiconductor alloy 28 can be formed utilizing standard processes well known in the art. In one embodiment, a self-aligned process can be employed. Typically, the metal semiconductor alloy 28 formation includes forming a metal capable of reacting with a semiconductor material atop the entire structure shown in FIG. 2, forming a barrier layer atop the metal, heating the structure to form a metal semiconductor alloy, removing non-reacted metal and the barrier layer and, if needed, conducting a second heating step. The second heating step is typically required in embodiments in which the first heating step does not form the lowest resistance phase of the metal semiconductor alloy. The metal used in forming the metal semiconductor alloy 28 typically comprises one of Ti, Ni, Pt, W, Co, and Ir. Alloying additives as known to those skilled in the art can also be present as desired. The heating, i.e., anneal, step used in forming the metal semiconductor alloy 28 includes conditions that are well known to those skilled in the art. In some embodiments, the formation of the metal semiconductor alloy 28 can occur atop the gate conductor 20, if the gate conductor is exposed and includes an upper layer of silicon or germanium.

Figure 4:
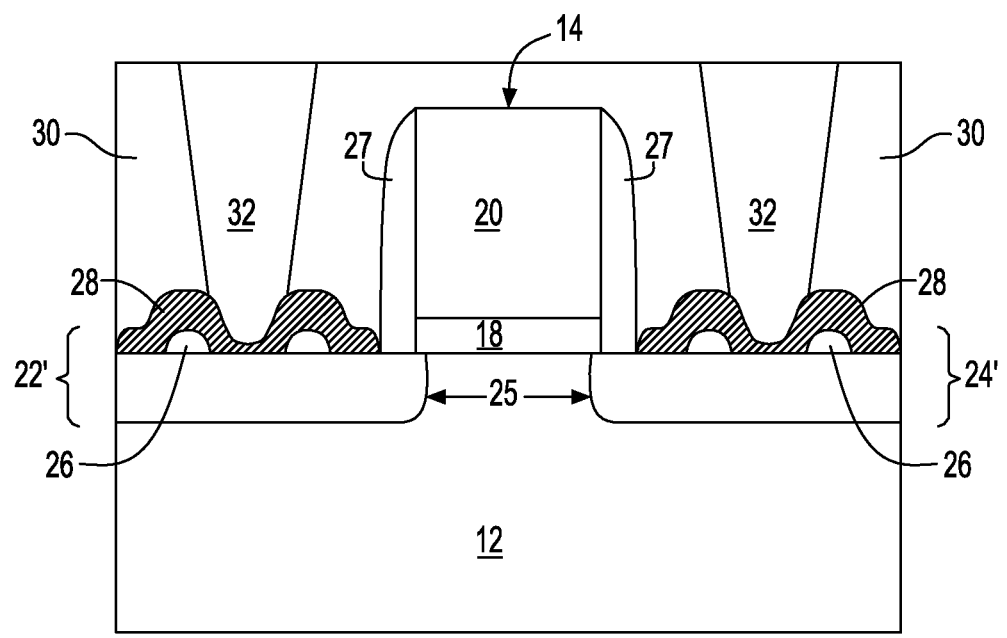
FIG. 4 is a pictorial representation (through a cross sectional view) illustrating the structure of FIG. 3 after forming a dielectric material that includes a conductively filled via contact that extends to an upper surface of the metal semiconductor alloy that is formed over the textured source region and the textured drain region of the at least one transistor.

Referring now to FIG. 4, there is illustrated the structure of FIG. 3, after forming a dielectric material 30 that includes at least one conductively filled via contact 32 that extends to an upper surface of the metal semiconductor alloy 28 that is formed over the textured source region 22' and the textured drain region 24'.

The dielectric material 30 can be comprised of any insulating material used in middle of the line (MOL) and/or back end of the line (BEOL) applications. The dielectric material 30 can be porous or non-porous. Some examples of suitable dielectrics that can be used as the dielectric material 30 include, but are not limited to $SiO_2$, a doped or undoped silicate glass, C doped oxides (i.e., organosilicates) that include atoms of Si, C, O and H, silsesquioxanes, thermosetting polyarylene ethers, or multilayers thereof, silicon nitride, silicon oxynitride or any combination, including multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. In one embodiment, the dielectric material 30 is $SiO_2$ that is formed from a TEOS (tetraethylorthosilane) precursor. The dielectric material 30 typically, but not necessarily always, has a dielectric constant that is about 4.0 or less, with a dielectric constant of about 2.8 or less being even more typical.

The dielectric material 30 can be formed utilizing any known deposition process including, but not limited to chemical vapor deposition, chemical enhanced vapor deposition, evaporation, physical vapor deposition and chemical solution deposition.

The thickness of the dielectric material 30 may vary depending upon the technique used in forming the same s well as the type of dielectric material used. Typically, and for normal MOL and/or BEOL applications, the dielectric material 30 has a thickness from 80 nm to 500 nm.

After forming the dielectric material 30, contact openings, e.g., vias, are formed into the dielectric material 30 by lithography and etching. The lithographic process includes forming a photoresist (not shown) atop the dielectric material 30, exposing the photoresist to a desired pattern of radiation and developing the exposed photoresist utilizing a conventional resist developer. The etching process includes a dry etching process (such as, for example, reactive ion etching, ion beam etching, plasma etching or laser ablation), or a wet chemical etching process that selectively removes the exposed dielectric material 30. Typically, reactive ion etching is used in providing the contact openings. After etching, the photoresist is typically removed utilizing a conventional resist stripping process well known to those skilled in this art. The contact openings have sidewalls which can be substantially vertical or some tapering may be evident. The contact openings that are formed typically have an aspect ratio that is greater than 1:1, more typically greater than 3:1.

Next, the contact opens are filled with a conductive material forming the at least one conductively filled via contact 32 in dielectric material 30. As shown, the at least one conductively filled via contact 32 extends to an upper surface of the metal semiconductor alloy 28 that is formed over the textured source region 22' and the textured drain region 24'. The conductive material that can be employed in forming the at least one conductively filled via contact 32 includes, for example, a conductive metal, an alloy comprising at least one conductive metal, a metal silicide or any combination thereof. In one embodiment, the conductive material is a conductive metal including, for example, Cu, W or Al. Of these metals, Cu and W are typically employed in forming the at least on conductively filled via contact 32. The conductive material can be formed within the openings in the dielectric material 30 utilizing a conventional deposition process such as, for example, CVD, PECVD, ALD, PEALD, sputtering chemical solution deposition or plating (electro or electroless). In some embodiment, a planarization process such as chemical mechanical polishing and/or grinding can be used to remove conductive material from atop the upper surface of the dielectric material 30 to provide the structure shown in FIG. 4.

Figure 5:
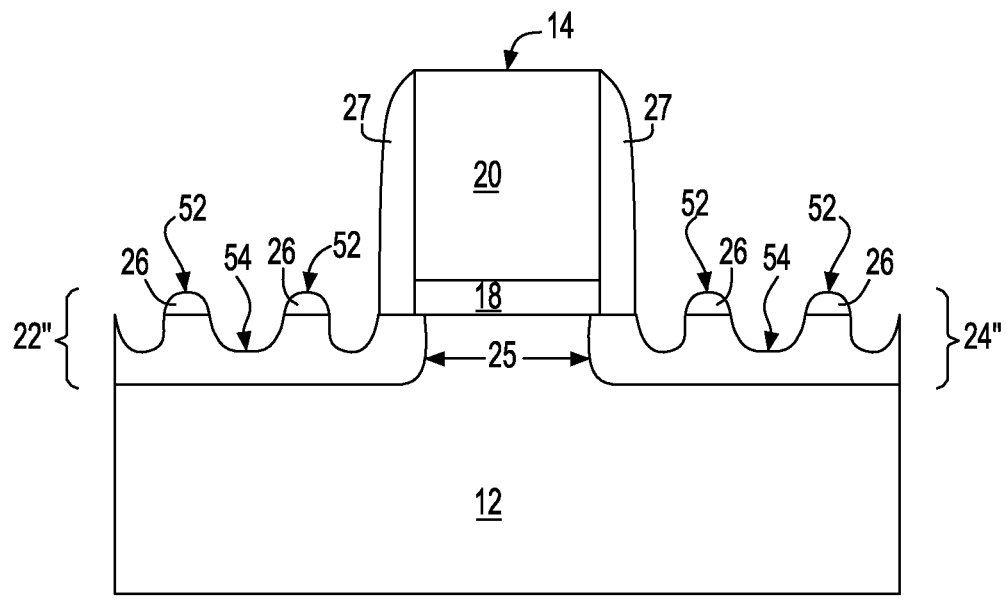
FIG. 5 is a pictorial representation (through a cross sectional view) illustrating the structure of FIG. 2 after etching exposed surfaces of the textured source region and the textured drain region to further enhance the surface area of both the source region and the drain region.
Figure 6:
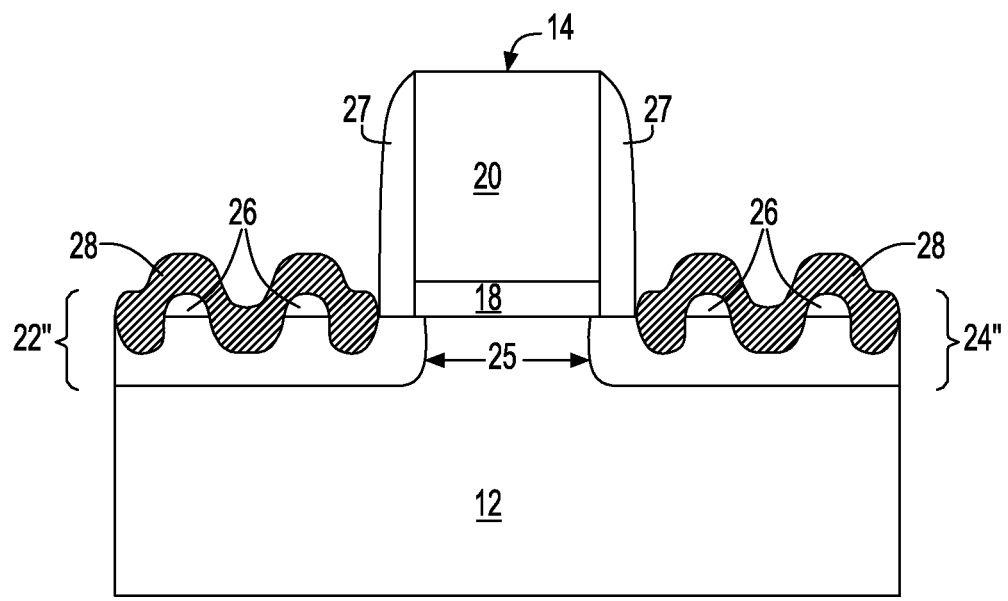
FIG. 6 is a pictorial representation (through a cross sectional view) illustrating the structure of FIG. 5 after forming a metal semiconductor alloy on the etched and textured source region and the etched and textured drain region of the at least one transistor.
Figure 7:
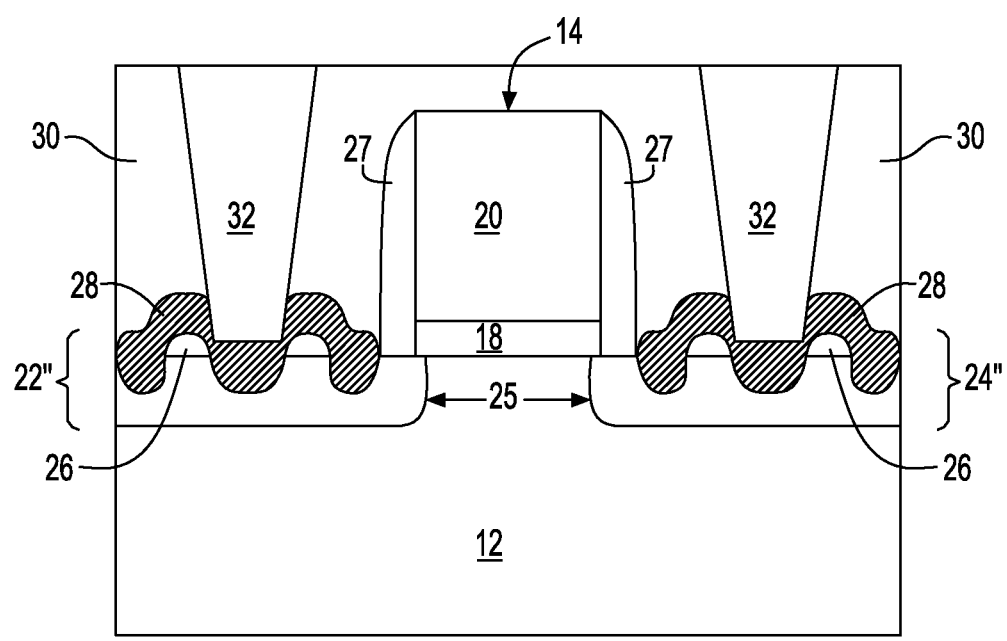
FIG. 7 is a pictorial representation (through a cross sectional view) illustrating the structure of FIG. 6 after forming a dielectric material that includes a conductively filled via contact that extends to an upper surface of the metal semiconductor alloy that is formed over both the etched and textured source region and the etched and textured drain region of the at least one transistor.

Reference is now made to FIGS. 5-7 which illustrate another embodiment of the invention. The embodiment shown in FIGS. 5-7 begins by first providing the structure shown in FIG. 2 of the first embodiment. That is, a structure as shown in FIG. 2 is first provided that includes hemispherical grained (HSG) semiconductor material 26 formed atop the source region 22 and the drain region 24 of transistor 14. In the particular, embodiment shown in FIGS. 5-7, the hemispherical grained (HSG) semiconductor material 26 is composed of a different semiconductor material as that present within the source and drain regions. For example and in one embodiment, the hemispherical grained (HSG) semiconductor material 26 may be composed of Si, and the substrate may be composed of SiGe. In another embodiment, the hemispherical grained (HSG) semiconductor material 26 may be composed of SiGe, and the substrate may be composed of Si.

Since hemispherical grained (HSG) semiconductor material 26 is composed of a different semiconductor material than that present in the source and drain regions, the different semiconductor materials have different etch rates associated therewith. As such, the hemispherical grained (HSG) semiconductor material 26 can be used as an etch mask during a subsequent etching process. Referring now to FIG. 5, there is illustrated the structure of FIG. 2 after etching exposed surfaces of the textured source region 22' and the textured drain region 24' by using the overlying hemispherical grained (HSG) material 26 as an etch mask to further enhance the surface area of both the source region and the drain region. In FIG. 5, reference numeral 24" is used to denote the textured and etched source region, while reference numeral 26" is used to denote the etched and textured drain region. It is again observed that in this embodiment the HSG semiconductor material 26 is composed of a different semiconductor material as that of the underlying substrate.

The etch used in this step of the present invention includes any etching process that can selectively remove the exposed portions of the textured source and drain regions relative to at least the hemispherical grained (HSG) semiconductor material 26. In one embodiment, the HSG semiconductor material 26 comprises silicon and the source/drain regions comprise SiGe. In such an embodiment, a solution comprising HF, $H_2O_2$, and $CH_3COOH$ can be used to etch SiGe source/drain regions selective to Si. In another embodiment, the HSG semiconductor material 26 comprises SiGe and the source/drain regions comprise silicon. In this embodiment, a solution comprising ammonium or TMAH can be used to etch Si selective to SiGe.

Referring now to FIG. 6, there is illustrated the structure of FIG. 5 after forming a metal semiconductor alloy 28 on the etched and textured source region 24" and the etched and textured drain region 26" of the at least one transistor 14. The metal semiconductor alloy 28 is the same as that described above and it is formed utilizing one of the techniques mentioned above as well.

Referring now to FIG. 7, there is illustrated the structure of FIG. 6 after forming a dielectric material 30 that includes a conductively filled via contact 32 that extends to an upper surface of the metal semiconductor alloy 28 that is formed over both the etched and textured source region 24" and the etched and textured drain region 26" of the at least one transistor 14. The dielectric material 30 and conductively filled via contact 32 are the same as those described above, and one of the techniques mentioned above can be used in forming both the dielectric material 30 and the conductively filled via contact 32.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing at least one transistor located within and upon a semiconductor substrate, said at least one transistor includes a gate stack located on an upper surface of the semiconductor substrate and a source region and a drain region located entirely beneath said upper surface of the semiconductor substrate at a footprint of the gate stack, wherein said source region and said drain region have a planar upper surface and are located entirely beneath said upper surface of said semiconductor substrate;
   texturing at least one of said source region and drain region to include a roughened surface that has at least one peak and at least one valley, wherein said texturing comprises depositing a hemispherical grained semiconductor material directly on the planar upper surface of said at least one of the source region and the drain region, and etching exposed planar surfaces of said at least one of the source region and the drain region utilizing said hemispherical grained semiconductor material as an etch mask;
   forming a contiguous metal semiconductor alloy on an entirety of the textured surface of said at least one of said source region and said drain region and directly on all exposed semiconductor material portions of said at least one of the source region and the drain region not covered by a dielectric spacer that is located on sidewalls of said at least one transistor, wherein a portion of said contiguous metal semiconductor alloy directly contacts a surface of said dielectric spacer; and
   forming a conductively filled via contact atop the metal semiconductor alloy.

2. The method of claim 1, wherein said hemispherical grained semiconductor material is formed by chemical vapor deposition.

3. The method of claim 1, wherein said etching includes ammonia.

4. The method of claim 1, wherein said hemispherical grained semiconductor material is comprised of a different semiconductor material from said semiconductor substrate.

5. The method of claim 1, wherein both said source region and said drain region are textured to include said roughened surface.

6. The method of claim 1, wherein said forming said contiguous metal semiconductor alloy includes forming a metal layer atop the roughened surface, and annealing.

7. The method of claim 1, wherein said hemispherical grained semiconductor material is amorphous or single-crystalline.

8. The method of claim 1, wherein the hemispherical grained semiconductor material is comprised of silicon, silicon germanium, or germanium.

9. The method of claim 1, wherein said hemispherical grained semiconductor material is doped with a same type of dopant as present in the source region and the drain region.

10. The method of claim 9, wherein said dopant can be introduced into the hemispherical grained semiconductor material utilizing an in-situ dopant technique.

11. The method of claim 1, wherein said hemispherical grained semiconductor material is formed by a selective deposition process.

12. The method of claim 1, wherein said hemispherical grained semiconductor material is polycrystalline.

13. The method of claim 1, wherein said hemispherical grained semiconductor material comprises silicon and said source region and said drain region comprise SiGe, and said etching comprises a solution comprising HF, $H_2O_2$, and $CH_3COOH$.

14. The method of claim 1, wherein said hemispherical grained semiconductor material comprises SiGe and said source region and said drain region comprise Si, and said etching comprises a solution comprising ammonium or tetramethylammonia hydroxide (TMAH).

15. The method of claim 1, wherein said conductively filled via comprises a conductive metal selected from Cu, W and Al.

16. The method of claim 1, wherein said depositing said hemispherical grained semiconductor material is performed at a temperature from 350° C. to 1000° C.

17. A method of fabricating a semiconductor structure comprising:
providing at least one transistor located within and upon a semiconductor substrate, said at least one transistor includes a gate stack located on an upper surface of the semiconductor substrate and a source region and a drain region located entirely beneath said upper surface of the semiconductor substrate at a footprint of the gate stack, wherein said source region and said drain region have a planar upper surface;
texturing at least one of said source region and drain region to include a roughened surface that has at least one peak and at least one valley, wherein said texturing comprises depositing a hemispherical grained semiconductor material directly on the planar upper surface of said at least one of the source region and the drain region, and etching exposed planar surfaces of said at least one of the source region and the drain region utilizing said hemispherical grained semiconductor material as an etch mask;
forming a contiguous metal semiconductor alloy on an entirety of the textured surface of said at least one of said source region and said drain region and directly on all exposed semiconductor material portions of said at least one of the source region and the drain region not covered by a dielectric spacer that is located on sidewalk of said at least one transistor, wherein a portion of said contiguous metal semiconductor alloy directly contacts a surface of said dielectric spacer; and
forming a conductively filled via contact atop the metal semiconductor alloy, wherein said hemispherical grained semiconductor material comprises silicon and said source region and said drain region comprise SiGe, and said etching comprises a solution comprising HF, $H_2O_2$ and $CH_3COOH$.

18. A method of fabricating a semiconductor structure comprising:
providing at least one transistor located within and upon a semiconductor substrate, said at least one transistor includes a gate stack located on an upper surface of the semiconductor substrate and a source region and a drain region located entirely beneath said upper surface of the semiconductor substrate at a footprint of the gate stack, wherein said source region and said drain region have a planar upper surface;
texturing at least one of said source region and drain region to include a roughened surface that has at least one peak and at least one valley, wherein said texturing comprises depositing a hemispherical grained semiconductor material directly on the planar upper surface of said at least one of the source region and the drain region, and etching exposed planar surfaces of said at least one of the source region and the drain region utilizing said hemispherical grained semiconductor material as an etch mask;
forming a contiguous metal semiconductor alloy on an entirety of the textured surface of said at least one of said source region and said drain region and directly on all exposed semiconductor material portions of said at least one of the source region and the drain region not covered by a dielectric spacer that is located on sidewalls of said at least one transistor, wherein a portion of said contiguous metal semiconductor alloy directly contacts a surface of said dielectric spacer; and
forming a conductively filled via contact atop the metal semiconductor alloy, wherein said hemispherical grained semiconductor material comprises SiGe and said source region and said drain region comprise Si, and said etching comprises a solution comprising ammonium or tetramethylammonia hydroxide (TMAH).

* * * * *